(12) United States Patent
Cha et al.

(10) Patent No.: US 9,761,688 B2
(45) Date of Patent: Sep. 12, 2017

(54) METHOD OF FABRICATING SEMICONDUCTOR DEVICE WITH TILTED PREAMORPHIZED IMPLANT

(71) Applicant: SK hynix Inc., Gyeonggi-do (KR)

(72) Inventors: Jae-Chun Cha, Gyeonggi-do (KR);
An-Bae Lee, Gyeonggi-do (KR);
Ah-Young Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/184,347

(22) Filed: Jun. 16, 2016

(65) Prior Publication Data

US 2017/0179253 A1    Jun. 22, 2017

(30) Foreign Application Priority Data

Dec. 22, 2015 (KR) .................. 10-2015-0183456

(51) Int. Cl.
*H01L 29/66* (2006.01)
*H01L 21/265* (2006.01)

(52) U.S. Cl.
CPC .. *H01L 29/66492* (2013.01); *H01L 21/26586* (2013.01); *H01L 29/665* (2013.01)

(58) Field of Classification Search
CPC ............. H01L 29/66492; H01L 29/665; H01L 21/26586
See application file for complete search history.

(56) References Cited

U.S. PATENT DOCUMENTS

| | | | |
|---|---|---|---|
| 5,561,072 A | 10/1996 | Saito | |
| 7,482,255 B2 | 1/2009 | Graoui et al. | |
| 9,064,797 B2 | 6/2015 | Tsai et al. | |
| 2002/0024078 A1* | 2/2002 | Horiuchi | H01L 21/2652 257/297 |
| 2006/0160338 A1* | 7/2006 | Graoui | H01L 21/26506 438/527 |
| 2008/0020556 A1* | 1/2008 | Park | H01L 21/26506 438/525 |
| 2010/0109046 A1* | 5/2010 | Mehandru | H01L 21/26506 257/190 |
| 2013/0240957 A1* | 9/2013 | Lee | H01L 21/26506 257/288 |
| 2014/0048886 A1 | 2/2014 | Chuang et al. | |

* cited by examiner

*Primary Examiner* — Selim Ahmed

(74) *Attorney, Agent, or Firm* — IP & T Group LLP

(57) ABSTRACT

A method for fabricating a semiconductor device may include: preparing a semiconductor substrate including a doping region; performing tilt implantation using a first additional dopant to form an amorphous region in the doping region; doping a second additional dopant in the amorphous region; forming a metal layer on the doped amorphous region; and reacting the doped amorphous region with the metal layer to form metal silicide.

19 Claims, 14 Drawing Sheets

METHOD OF FABRICATING SEMICONDUCTOR DEVICE WITH TILTED PREAMORPHIZED IMPLANT

CROSS-REFERENCE TO RELATED APPLICATIONS

The present application claims priority of Korean Patent Application No. 10-2015-0183456, filed on Dec. 22, 2015, which is herein incorporated by reference in its entirety.

BACKGROUND

1. Field

Exemplary embodiments of the present invention relate to a semiconductor device, and more particularly, to a semiconductor device including silicide and a method for fabricating the same.

2. Description of the Related Art

In fabricating a semiconductor device, silicide is formed to suppress a leakage current and contact resistance. As a semiconductor device is reduced in size, a contact structure is also fabricated in a micro size. That is, an open area of a contact hole is reduced and the height of the contact hole gradually increases.

Accordingly, as a semiconductor device is fabricated in a micro size, a method for further reducing contact resistance is required.

SUMMARY

Various embodiments are directed to a semiconductor device capable of improving contact resistance and a method for fabricating the same.

In an embodiment, a method for fabricating a semiconductor device may include: preparing a semiconductor substrate including a doping region; performing tilt implantation using a first additional dopant to form an amorphous region in the doping region; doping a second, additional dopant in the amorphous region; forming a metal layer on the doped amorphous region; and reacting the doped amorphous region with the metal layer to form metal silicide. The first additional dopant may include germanium (Ge). The tilt implantation of the first additional dopant may be performed at a tilt angle of 1° to 45°. The first additional dopant may include C, N, F, Si, Sn, In, Xe, or a combination thereof. The tilt implantation of the first additional dopant may be performed with the semiconductor substrate being rotated. The tilt implantation of the first additional dopant may be performed at a dose of $1.0\times10^{13}$ atoms/cm$^2$ to $1.0\times10^{16}$ atoms/cm$^2$, with ion implantation energy of 0.1 key to 60 keV, and at an electrostatic chuck temperature of $-150°$ C. to 400° C. The doping of the second additional dopant may be performed by plasma doping, zero-tile implantation, tile implantation, or a combination thereof. The second additional dopant may include a boron-based material. The second additional dopant may include B, BF, $BF_2$, $BF_3$, $B_2H_6$, P, As, Sb, or a combination thereof. The doping region may include a source/drain region of a PMOSFET. The method may further include forming a metal material coupled to the metal silicide.

In another embodiment, a method for fabricating a semiconductor device may include: forming a transistor including a source/drain region in a semiconductor substrate; forming an interlayer dielectric layer over the semiconductor substrate; patterning the interlayer dielectric layer to form a contact hole that exposes the source/drain region; performing germanium tilt implantation to form an amorphous region in the source/drain region; doping a boron-based material in the amorphous region; forming a metal layer on the doped amorphous region; and reacting the doped amorphous region with the metal layer to form metal silicide. The method may further include removing an unreacted metal layer remaining on the metal silicide; and forming a contact material filling the contact hole and coupled to the metal silicide. The germanium implantation may be performed at a tilt angle of 1° to 45°. The germanium implantation may be performed with the semiconductor substrate being rotated. The germanium implantation may be performed at a dose of $1.0\times10^{13}$ atoms/cm$^2$ to $1.0\times10^{16}$ atoms/cm$^2$, with ion implantation energy of 0.1 keV to 60 k keV, and at an electrostatic chuck temperature of $-150°$ C. to 400° C. The doping of the boron-based material on the amorphous region may be performed by plasma doping zero-tile implantation, tile implantation, or a combination thereof. The boron-based material may include $B_2H_6$. The source/drain region may include a p type doped source/drain region of a PMOSFET. The metal silicide may include cobalt silicide.

In another embodiment, a method for fabricating semiconductor device may include: forming a transistor including a contact node region in a semiconductor substrate; forming a polysilicon plug on the contact node region; performing germanium tilt implantation to form an amorphous region in an upper portion of the polysilicon plug; doping a boron-based material in the amorphous region; forming a metal layer on the doped amorphous region; reacting the doped amorphous region with the metal layer to form metal silicide; forming a metal plug on the metal silicide; and forming a capacitor coupled to the metal plug.

DETAILED DESCRIPTION

Figure 1:
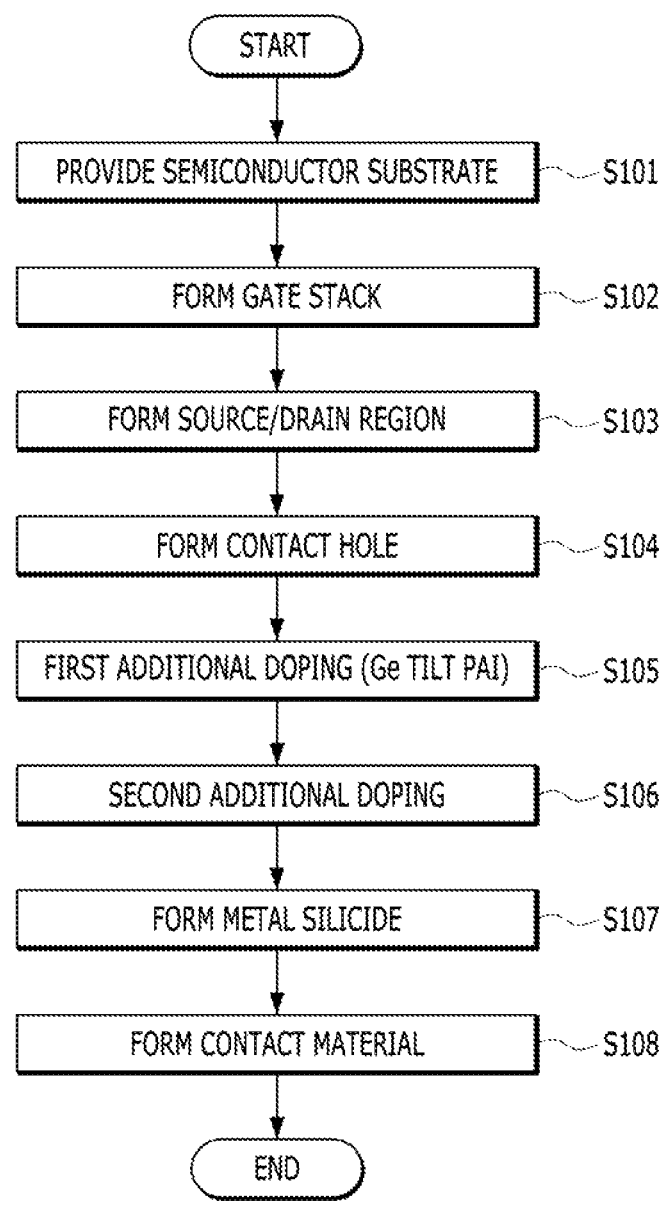
FIG. 1 is a flowchart illustrating a method for fabricating a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

FIG. 1 is a flowchart illustrating a method for fabricating a semiconductor device in accordance with a first embodiment. Referring to FIG. 1, a semiconductor device may be provided (S101). A gate stack may be formed on the semiconductor device (S102). A source/drain region may be formed (S103). A contact hole may be formed (S104). First additional doping may be performed (S105). Second additional doping may be performed (S106). A silicide process may be performed (S107). A contact material may be formed (S108). The first additional doping may include germanium tilt pre-amorphization implant (Ge tilt PAI).

Figure 2:
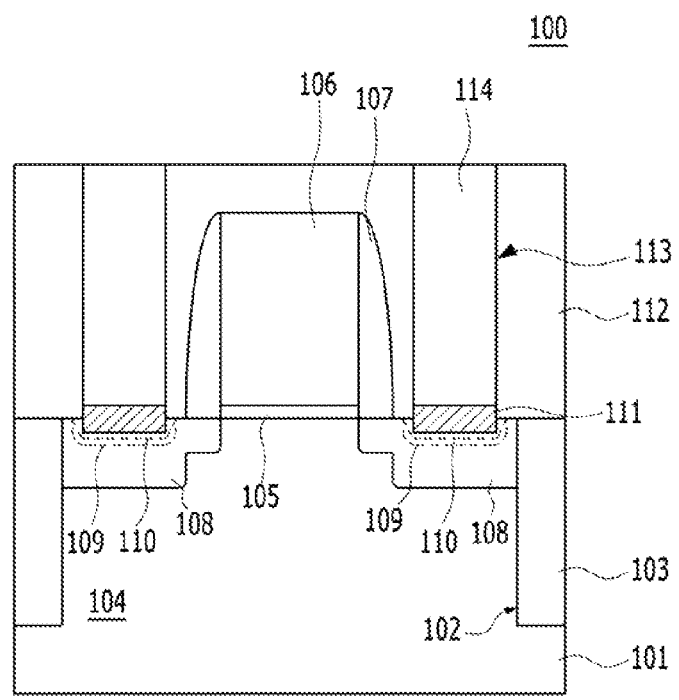
FIG. 2 is a diagram illustrating a semiconductor device of FIG. 1.

FIG. 2 is a diagram illustrating the semiconductor device of FIG. 1. The semiconductor device may include a transistor 100. The transistor 100 may include a PMOSFET. Referring to FIG. 2, an isolation layer 103 and an active region 104 may be formed in a substrate 101. The isolation layer 103 may fill in an isolation trench 102.

A gate stack may be formed on the active region 104. The gate stack may include a gate insulating layer 105 and a gate electrode 106. The gate stack may further include a spacer 107 which is formed over a sidewall of the gate electrode 106. The spacer 107 may include silicon oxide, silicon nitride, or a combination thereof.

A source/drain region 108 may be formed in the active region 104 at both sides of the gate stack. An interlayer dielectric layer 112 may be formed on the gate stack and the substrate 101. The interlayer dielectric layer 112 may include a contact hole 113 exposing the source/drain region 108. The source/drain region 108 may include a P type dopant.

A first additional doping region 109 may be formed in the source/drain region 108. A second additional doping region 110 may be formed in the first additional doping region 109. The contact hole 113 may expose a part of the second additional doping region 110. The first additional doping region 109 may include germanium. The first additional doping region 109 may be formed by germanium tilt pre-amorphization implant. The second additional doping region 110 may include boron.

A metal silicide 111 may be formed on the second additional doping region 110. A contact material 114 may be formed on the metal silicide 111. The contact material 114 may fill the contact hole 113. The metal silicide 111 may include titanium silicide or cobalt silicide. The contact material 114 may include tungsten.

Figure 3A:
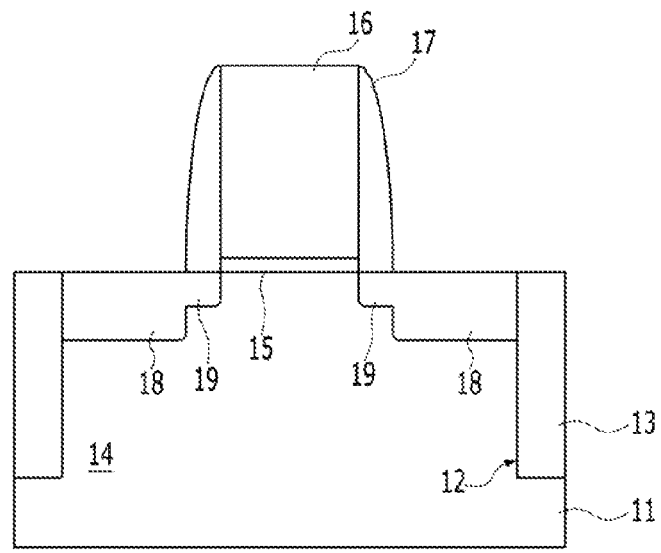
FIG. 3A to FIG. 3G are sectional views illustrating a method for fabricating a semiconductor device in accordance with the first embodiment.

FIG. 3A to FIG. 3G are sectional views illustrating a method for fabricating the semiconductor device in accordance with the first embodiment. As illustrated in FIG. 3A, an isolation layer 13 and an active region 14 may be formed in a substrate 11.

The substrate 11 may be a material suitable for semiconductor processing. The substrate 11 may include a semiconductor substrate. The substrate 11 may include a silicon-containing material. The substrate 11 may include silicon, single crystalline silicon, polysilicon, amorphous silicon, silicon germanium, single crystalline silicon germanium, multi-crystalline silicon germanium, carbon-doped silicon, a combination thereof, or a multilayer thereof. The substrate 11 may also include another semiconductor material such as germanium. The substrate 11 may also include a III group semiconductor substrate, for example, a compound semiconductor substrate such as GaAs. The substrate 11 may also include a SOI (Silicon On Insulator) substrate.

The isolation layer 13 may be a Shallow Trench Isolation (STI) region. The isolation layer 13 may be formed by filling a shallow trench, for example, filling an insulation material in an isolation trench 12. The isolation layer 13 may include silicon oxide, silicon nitride, or a combination thereof. The active region 14 may have a bar shape or a line shape.

A gate stack may be formed on the substrate 11. The gate stack may include a gate insulating layer 15 and a gate electrode 16. A spacer 17 may be formed at both sidewalls of the gate stack. The gate insulating layer 15 may include silicon oxide, silicon nitride, silicon oxynitride, a High-k material, or a combination thereof. The High-k material may include a material having a dielectric constant larger than that of silicon oxide. For example, the High-k material may include a material having a dielectric constant larger than 3.9. In another example, the High-k material may include a material having a dielectric constant larger than 10. In further another example, the High-k material may include a material having a dielectric constant of 10 to 30.

The High-k material may include one or more metallic elements. The High-k material may include a hafnium-containing material. The hafnium-containing material may include hafnium oxide, hafnium silicon oxide, hafnium silicon oxynitride, or a combination thereof. In another example, the High-k material may include lanthanum oxide, lanthanum aluminum oxide, zirconium oxide, zirconium silicon oxide, zirconium silicon oxynitride, aluminum oxide, and a combination thereof. Well-known other High-k materials may also be selectively used as the High-k material. The gate insulating layer 15 may include a stack of an interfacial layer and the High-k material. The interfacial layer may include silicon oxide and the High-k material may include a hafnium-based material.

The gate electrode 16 may include doped polysilicon, a metal, a metal alloy, silicide, or one, two or more conductive materials. The gate electrode 16 may include a multilayer structure having multiple metal materials. In another embodiment, to obtain an improved threshold voltage, the gate electrode 16 may include a material obtained by tuning a work function. In some embodiments, the gate electrode 16 may be a material having a work function equal to or less than 4.5 eV for a NMOSFET. In another embodiment, the gate electrode 16 may be a material having a work function equal to or more than 4.5 eV for a PMOSFET. The s pacer 17 may include silicon oxide, silicon nitride, or a combination thereof. In the present embodiment the gate electrode 16 may be a part of the PMOSFET.

Doping regions may be formed in the active region 14 under both sides of the gate stack. The doping regions may include a source/drain region 18. The source/drain region 18 may be formed by a doping process such as implantation. The source/drain region 18 is a region doped with a dopant material such as an n type dopant and a p type dopant. For example, the dopant material may include phosphorous (P), arsenic (As), antimony (Sb), or boron (B). The source/drain region 18 may include a Lightly Doped Drain (LDD) region 19 or Source Drain Extension (SDE).

In detail, the LDD region 19 may have a dopant concentration lower than that of the source/drain region 18. The LDD region 19 and the source/drain region 18 may include substantially the same dopant. In the present embodiment, the source/drain region 18 and the LDD region 19 may be a part of the PMOSFET. In another embodiment, the source/drain region 18 and the LDD region 19 may be a part of the NMOSFET. In a NMOSFET, the source/drain region 18 may be an n type doped source/drain region of the NMOSFET.

Figure 3B:
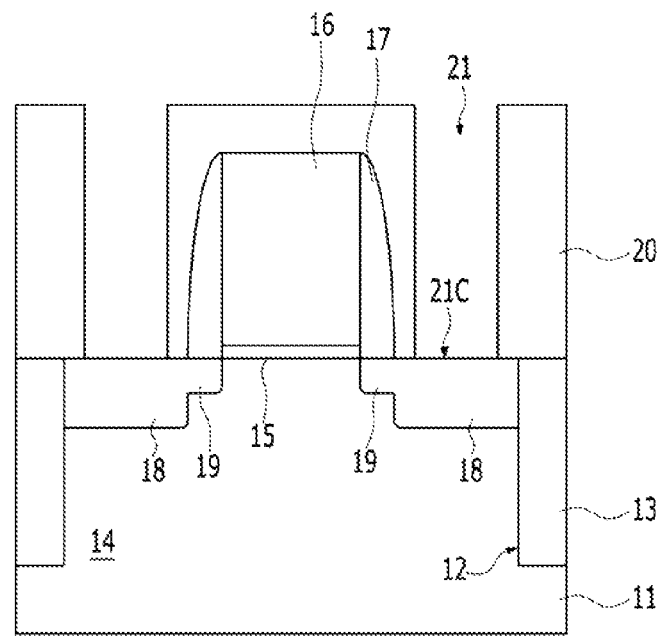

As illustrated in FIG. 3B, an interlayer dielectric layer (ILD) 20 may be formed on the substrate 11. The interlayer dielectric layer 20 may include silicon oxide, silicon nitride, or a combination thereof. The interlayer dielectric layer 20 may be formed using a low-k material. In some embodiments, before the interlayer dielectric layer 20 is formed, an etching stop layer (not shown) may be formed. The etching stop layer may include silicon nitride.

A contact hole 21 may be formed in the interlayer dielectric layer 20. The contact hole 21 may expose a part of the source/drain region 18. The contact hole 21 may be formed by photolithography and etching processes. In one embodiment, patterned photoresist (not illustrated) may be formed and used as an etching mask so that the interlayer dielectric layer 20 may be etched. In another embodiment, the contact hole 21 may be called a contact opening. A sidewall of the contact hole 21 may have a vertical profile or a tapered profile. By the contact hole 21, a source/drain contact region 21C may be exposed.

In the present embodiment, to reduce contact resistance, after the contact hole 21 is formed, an additional doping process may be performed. That is, to reduce contact resistance between a contact material and the source/drain region 18, the additional doping process may be performed. In the additional doping process, to maximize ion implantation effects, a first additional doping process 22 and a second additional doping process 24 may be sequentially performed.

Figure 3C:
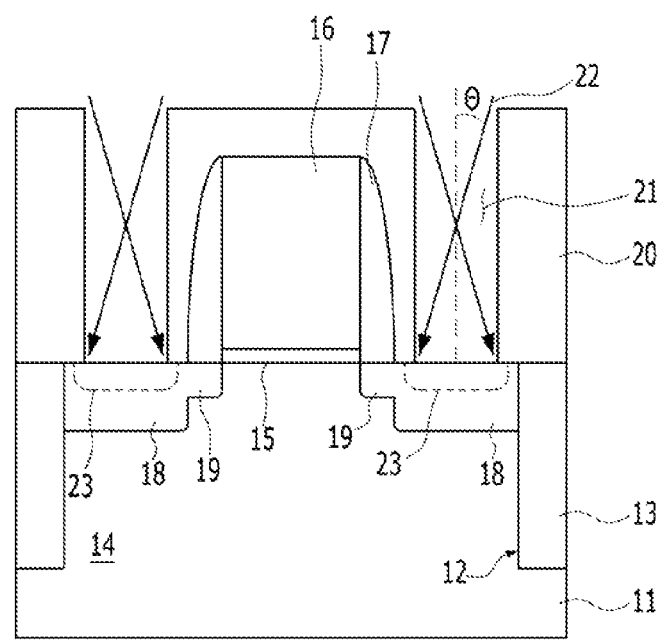

As illustrated in FIG. 3C, the first additional doping process 22 may be performed. The first additional doping process 22 may include tilt implantation. In the first additional doping process 22 the substrate 11 may be implanted with a first additional dopant. The first additional doping process 22 may be performed on the surface of the source/drain region 18. By the first additional doping process 22, the first additional doping region 23 may be formed in the surface of the source/drain region 18. The first additional doping region 23 may be an amorphous region. That is, the surface of the source/drain region 18 may be subjected to amorphization by the first additional doping process 22. Accordingly, the first additional doping process 22 may be called pre-amorphization implant (PAI).

In the present embodiment, the first additional doping process 22 may be performed with germanium implant. This may be called germanium pre-amorphization implant (Ge PAI). Since the first additional doping process 22 uses the tilt implantation, it may be called germanium tilt pre-amorphization implant (Ge tilt PAI). In another embodiment, the first additional doping process 22 may use other implant species. For example, implant species such as C, N, F, Si, Xe or a combination thereof may be used in the first additional doping process 22.

In the case of the germanium implant, the degree of activation of boron of the source/drain region 18 may be improved and the diffusion of the boron may be controlled. The first additional doping process 22 may be performed at a tilt angle θ of 1° to 45° with respect to a vertical line. The vertical line is perpendicular to an upper surface of the substrate 11. The tilt angle θ may vary depending on an aspect ratio of the contact hole 21. Furthermore, to reduce shadow effects, the tilt implantation may be performed while rotating the substrate 11 about 2 times to about 32 times. A dose may be adjusted to $1.0 \times 10^{13}$ atoms/cm$^2$ to $1.0 \times 10^{15}$ atoms/cm$^2$, and ion implantation energy may be adjusted to 0.1 keV to 60 keV.

The germanium tilt pre-amorphization implant (Ge tilt PAI) may be performed at room temperature. To improve effects of the germanium tilt pre-amorphization implant (Ge tilt PAI), cold temperature implantation or hot temperature implantation may be used in germanium (Ge) ion implantation. The cold temperature implantation may be performed at a temperature equal to or less than 0° C. and the hot temperature implantation may be performed at room temperature or more. For example, the temperature of an electrostatic chuck (ESC) may be adjusted to −150° C. to 400° C. The first additional doping process 22 may use cold temperature tilt implantation, room temperature tilt implantation, or hot temperature tilt implantation.

Figure 3D:
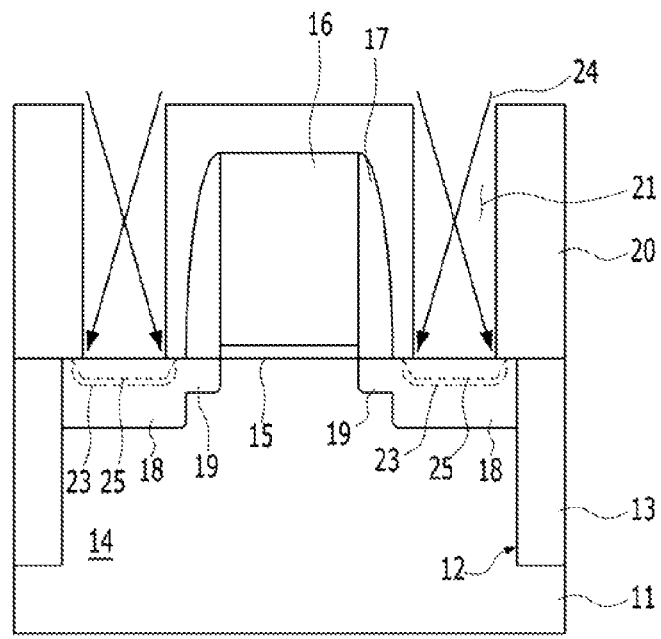

As illustrated in FIG. 3D, the second additional doping process 24 may be performed. By the second additional doping process 24, a second additional doping region 25 may be formed. The second additional doping process 24 may be performed with a second additional dopant different from the first additional dopant. In the second additional doping process 24, a boron-based dopant may be used. The boron-based material may include B, $BF_2$, $BF_3$, or $B_2H_6$.

The second additional doping process 24 may be performed by implantation or plasma doping (PLAD). For example, in the case of using $B_2H_6$ as the boron-based dopant, it is advantageous to dope a great amount of boron in a short time through the plasma doping (PLAD) such that contact resistance is also very superior. In another embodiment, the second additional dopant may include P, As, In, Sb, or a combination thereof.

In the second additional doping process 24, zero tilt-implantation may be performed with respect to the substrate 11 that is, implantation may be performed a vertical direction with respect to the upper surface of the substrate 11. In another embodiment, the second additional doping process 24 may include tilt implantation. In another embodiment, the second additional doping process 24 may include cold temperature tilt implantation, room temperature tilt implantation, or hot temperature tilt implantation. In another embodiment, the second additional doping process 24 may be performed at a tilt angle of 1° to 45°. Furthermore, the tilt implantation may be performed while rotating the substrate 11 about 2 times to about 32 times. In another embodiment, after an additional doping process of boron, additional doping of germanium may be performed.

As described above, in the present embodiment, an additional doping process may be performed which includes the germanium tilt implantation and the boron tilt implantation.

Due to a reduction of the open area and an increase in the aspect ratio of the contact hole 21, when the germanium pre amorphization implant (Ge PAI) is performed, non-uniform ion implantation damage and non-uniform concentration distribution may occur between a center and an edge of the substrate 11. Therefore, crystalline defects such as dislocation occur. As a result, gate-induced drain leakage (GIDL) may occur and contact resistance characteristics may be deteriorated.

According to a method for improving the non-uniform ion implantation damage in the edge, it is possible to adjust the dose and the ion implantant energy of the germanium pre-amorphization implant (Ge PAI). However, due to a change in the concentration of germanium implanted in the substrate 11 and the boron depth-concentration profile, it is difficult to satisfy a desired transistor performance such as contact resistance, an on-current, and a short channel margin.

To improve performance, when the first additional doping process 22 is performed, an ion implantation angle is adjusted to a tilt angle other than 0°, so that it is possible to uniformly control the ion implantation damage between the center and the edge of the substrate 11. In addition, it is also possible to reduce the crystalline defects and to improve dopant activation at sides of the surface of a contact by the tilt implantation. As a consequence, it is possible to improve the gate-induced drain leakage (GIDL) and the contact resistance (Rc) characteristics by the germanium tilt pre-amorphization implant (Ge tilt PAI).

Figure 3E:
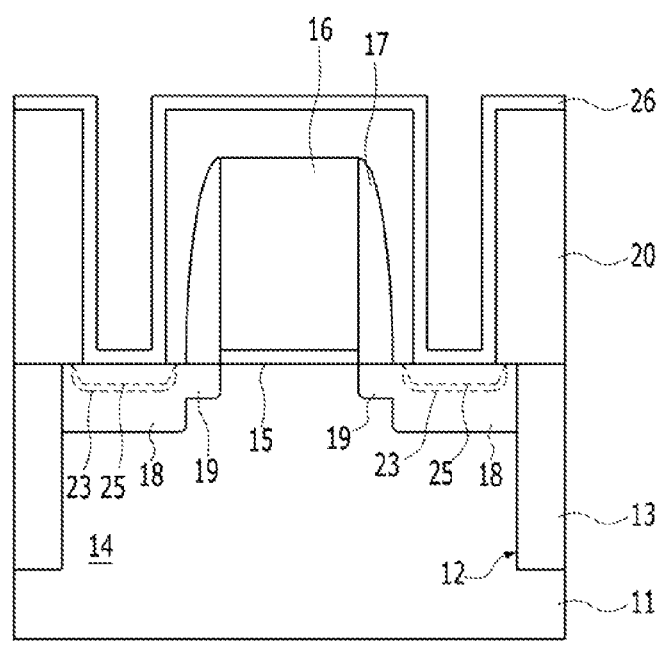
Figure 3F:
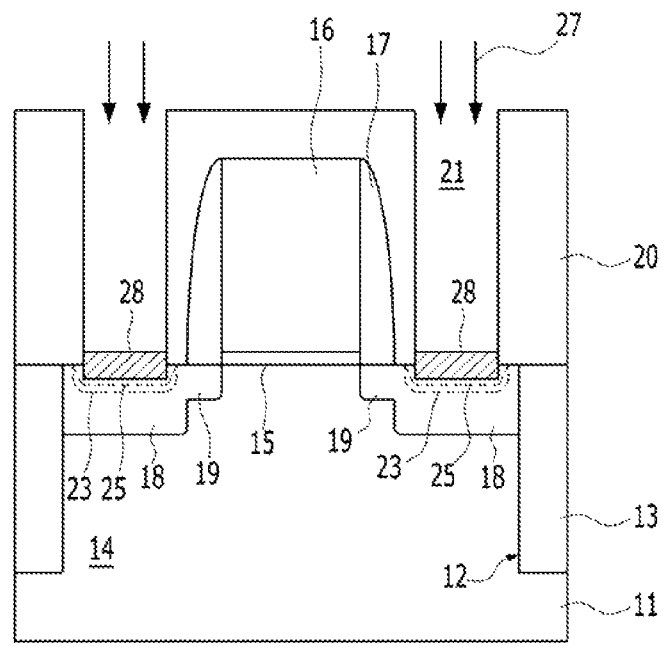

As illustrated in FIG. 3E and FIG. 3F, a metal silicide 28 may be formed on the source/drain region 18. The metal silicide 28 may be formed by a metal layer (26) deposition and heat treatment (27) process. Subsequently, after the metal silicide 28 is formed, an unreacted metal layer (26) may be removed. The metal layer (26) may include a material capable of forming the metal silicide 28. The metal layer (26) may include a titanium-based material or a cobalt-based material. The metal silicide 28 may include titanium silicide or cobalt silicide. The metal silicide 28 may also include metal silicide such as nickel silicide.

The metal silicide 28 may be formed when the metal layer (26) and the silicon included in the first and second additional doping regions 23 and 25 react with each other. When the metal silicide 28 is formed, a part of the first and second additional doping regions 23 and 25 may be silicified. In another embodiment, when the metal silicide 28 is formed, all the first and second additional doping regions 23 and 25 may be silicified. When the metal silicide 28 is formed, the first and second additional doping regions 23 and 25 may be crystallized.

Figure 3G:
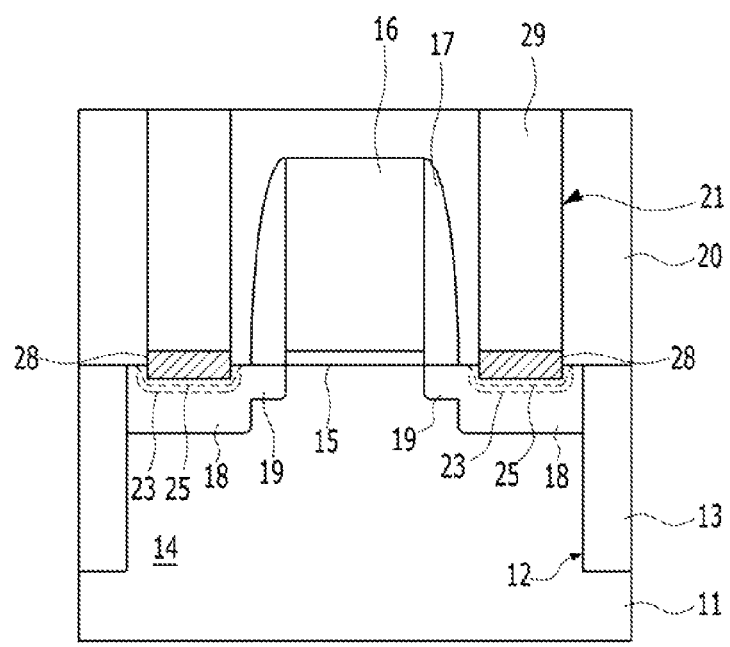

As illustrated in FIG. 3G, a contact material 29 may be formed. The contact material 29 may include one or more of tungsten, titanium, and titanium nitride. The metal silicide 28 may contact with the contact material 29. The contact material 29 may be formed by a process such as chemical vapor deposition (CVD). By a subsequent planarization process, the contact material 29 may remain in the contact hole 21. This may be called a 'contact plug'.

Figure 4:
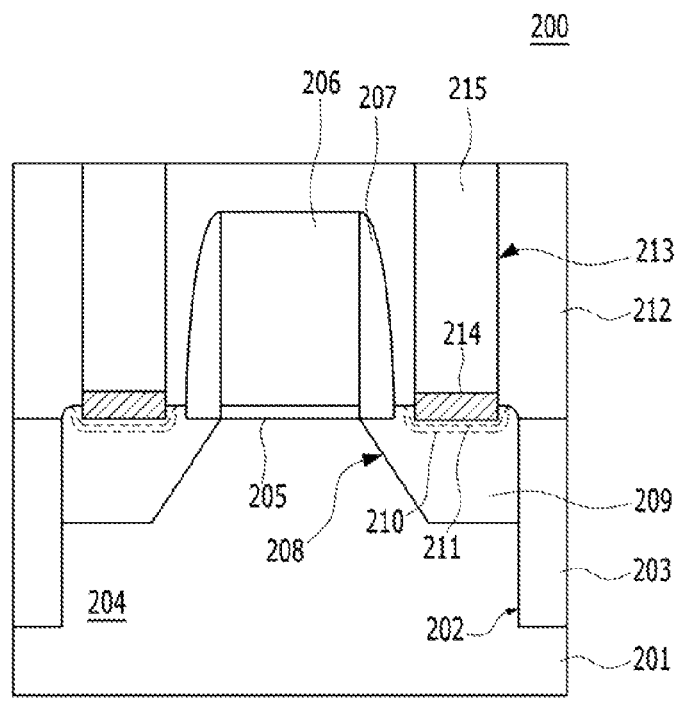
FIG. 4 is a diagram illustrating a semiconductor device in accordance with a second embodiment.

FIG. 4 is a diagram illustrating a semiconductor device in accordance with a second embodiment. As a part of the semiconductor device, a transistor 200 is illustrated. Some elements of the transistor 200 may be similar to those of the transistor 100.

Referring to FIG. 4, an isolation layer 203 and an active region 204 may be formed in a substrate 201. The isolation layer 203 may fill in an isolation trench 202. A gate stack may be formed on the active region 204. The gate stack may include a gate insulating layer 205 and a gate electrode 206. The gate stack may further include a spacer 207.

A source/drain region 209 may be formed in the active region 204 at both sides of the gate stack. The source/drain region 209 may be filled in a source/drain recess 208. The source/drain region 209 formed in the source/drain recess 208 may be called an 'embedded source/drain region'. The source/drain region 209 may be formed by silicon epitaxy or silicon germanium epitaxy.

An interlayer dielectric layer 212 may be formed on the substrate 201. The interlayer dielectric layer 212 may include a contact hole 213 for exposing the source/drain region 209.

A first additional doping region 210 may be formed in the source/drain region 209 through the contact hole 213. A second additional doping region 211 may be formed in the first additional doping region 210. The contact hole 213 may expose a part of the second additional doping region 211. The first additional doping region 210 may include germanium. The first additional doping region 210 may be formed by germanium tilt pre-amorphization implant. The second additional doping region 211 may include boron.

A metal silicide 214 may be formed on the second additional doping region 211. A contact material 215 may be formed on the metal silicide 214. The contact material 215 may fill the contact hole 213.

FIG. 5A to FIG. 5G are sectional views illustrating a method for fabricating the semiconductor device in accordance with the second embodiment. The second embodiment may be similar to the first embodiment.

Figure 5A:
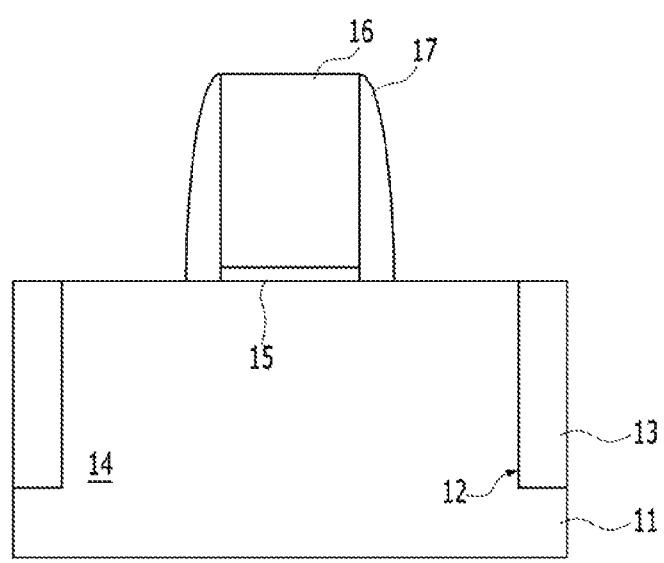
FIG. 5A to FIG. 5G are sectional views illustrating a method for fabricating a semiconductor device in accordance with the second embodiment.

As illustrated in FIG. 5A, an isolation layer 13 and an active region 14 may be formed in a substrate 11. A gate stack G may be formed on the substrate 11. The gate stack G may include a gate insulating layer 15 and a gate electrode 16. A spacer 17 may be formed at both sidewalls of the gate stack G. In the present embodiment, the gate stack G may be a part of a PMOSFET.

Figure 5B:
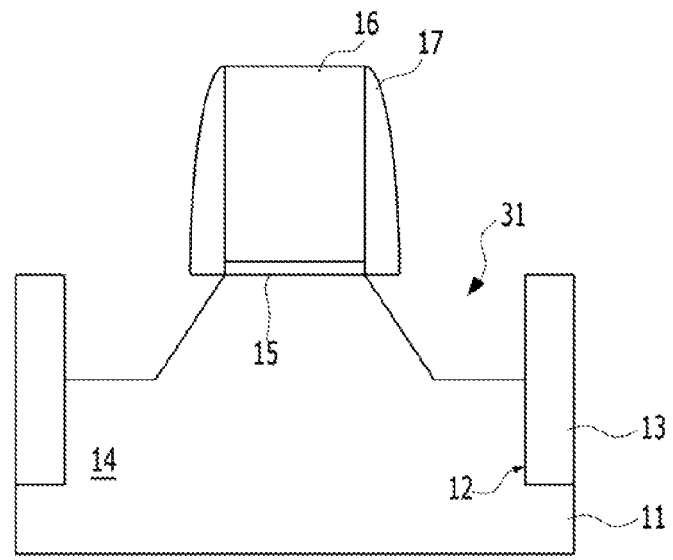

As illustrated in FIG. 5B, a source/drain recess 31 may be formed in the active region 14 of the substrate 11. The source/drain recess 31 may be formed with a sigma shape su that the source/drain recess 31 extends under the gate stack G.

Figure 5C:
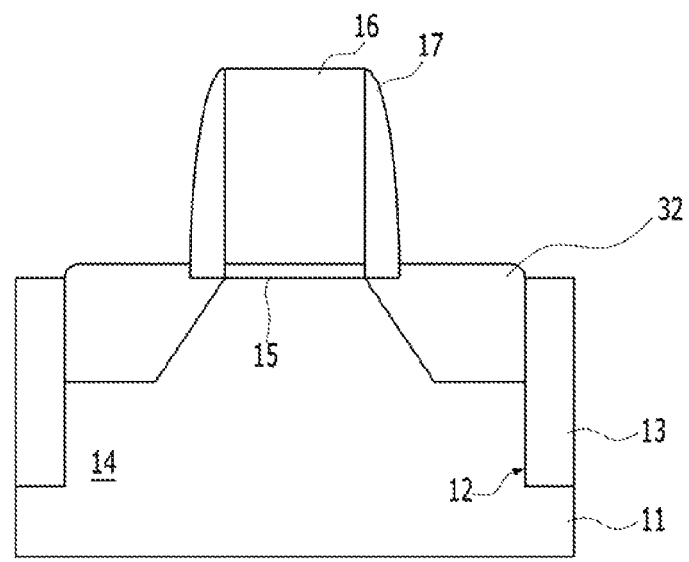

As illustrated in FIG. 5C, a source/drain region 32 may be formed. The source/drain region 32 may fill the source/drain recess 31. The source/drain region 32 may be formed by an epitaxy process. The source/drain region 32 may include silicon, silicon germanium, or a combination thereof. In the present embodiment, the source/drain region 32 may be formed by silicon germanium epitaxy. The source/drain region 32 formed as such is also called an embedded silicon germanium source/drain region (embedded SiGe S/D region; eSiGe).

The source/drain region 32 may be a region doped with a dopant material such as an n type dopant or a p type dopant in-situ. For example, the dopant material may include phosphorous (P), arsenic (As), antimony (Sb), or boron (B). In the present embodiment, the source/drain region 32 may be a part of the PMOSFET and thus the source/drain region 32 may have a structure in which boron has been doped. In another embodiment, the source/drain region 32 may be a part of a NMOSFET and thus the source/drain region 32 may have an embedded silicon (eSi) structure in which phosphorous or arsenic has been doped.

Figure 5D:
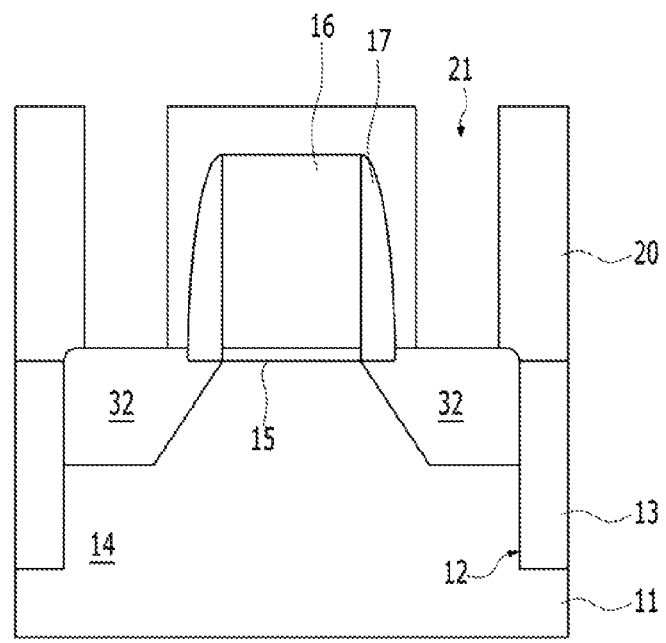

As illustrated in FIG. 5D, an interlayer dielectric layer 20 may be formed on the substrate 11. The interlayer dielectric layer 20 may include silicon oxide, silicon nitride, or a combination thereof. The interlayer dielectric layer 20 may be formed using a low-k material.

A contact hole 21 may be formed in the interlayer dielectric layer 20. The contact hole 21 may expose a part of the source/drain region 32.

In the present embodiment, to reduce contact resistance, an additional doping process may be performed after the contact hole 21 is formed. That is, to reduce contact resistance between a contact material and the source/drain region 32 the additional doping process may be performed.

In the additional doping process to maximize ion implantation effects, a first additional doping process 22 and a second additional doping process 24 may be performed in substantially the same manner as that of the first embodiment.

Figure 5E:
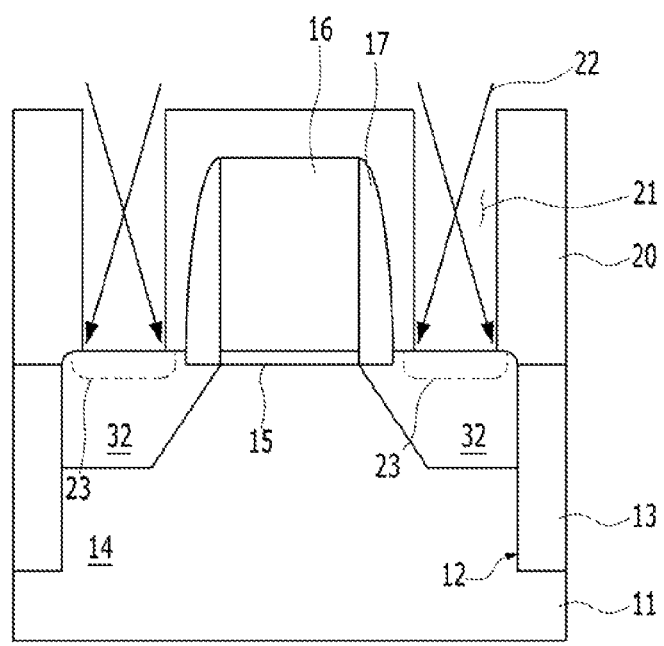

As illustrated in FIG. 5E, the first additional doping process 22 may be performed. The first additional doping process 22 may include tilt implantation. In the first additional doping process 22 the substrate 11 may be implanted with a first additional dopant. The first additional doping process 22 may be performed on the surface of the source/drain region 32. By the first additional doping process 22, a first additional doping region 23 may be formed on the surface of the source/drain region 32. The first additional doping region 23 may be an amorphous region. That is, the surface of the source/drain region 32 may be subjected to amorphization by the first additional doping process 22. Accordingly, the first additional doping process 22 may be called pre-amorphization implant (PAI).

In the present embodiment, the first additional doping process 22 may be performed with germanium implant. This may be called germanium pre-amorphization implant (Ge PAI). Since the first additional doping process 22 uses the tilt implantation, it may be called germanium tilt pre-amorphization implant (Ge tilt PAI). In another embodiment, the first additional doping process 22 may use other implant species. For example, implant species such as C, N, F, Si, Xe or a combination thereof may be used in the first additional doping process 22.

In the case of the germanium implant, the degree of activation of boron of the source/drain region 32 may be improved and the diffusion of the boron may be controlled. The first additional doping process 22 may be performed at a tilt angle θ of 1° to 45° according to an aspect ratio of the contact hole 21. Furthermore, to reduce shadow effects, the tilt implantation may be performed while rotating the substrate 11 about 2 times to about 32 times during the first additional doping process. A dose may be adjusted to $1.0 \times 10^{13}$ atoms/cm$^2$ to $1.0 \times 10^{16}$ atoms/cm$^2$, and ion implantation energy may be adjusted to 0.1 keV to 60 keV. The germanium tilt pre-amorphization plant (Ge tilt PAI) may be performed at room temperature.

In another embodiment, to improve effects of the germanium tilt pre-amorphization implant (Ge tilt PAI), cold temperature implantation or hot temperature implantation may be used in germanium (Ge) ion implantation. The cold temperature implantation may be performed at temperature equal to or less than 0° C. and the hot temperature implantation nay be performed at room temperature or more. For example, the temperature of an electrostatic chuck (ESC) may be adjusted to −159° C. to 400° C. The first additional doping process 22 may use cold temperature tilt implantation, room temperature tilt implantation or hot temperature tilt implantation.

Figure 5F:
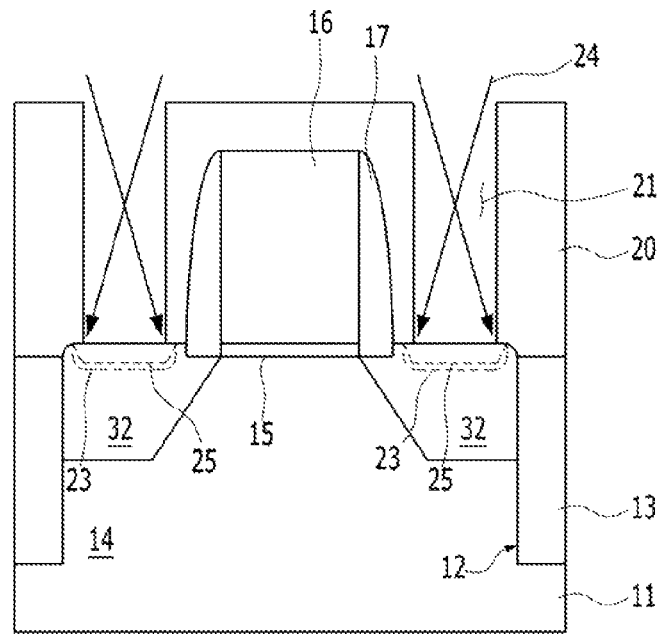

As illustrated in FIG. 5F, the second additional doping process 24 may be performed. By the second additional doping process 24, a second additional doping region 25 may be formed. The second additional doping process 24 may be performed with a second additional dopant different from the first additional dopant. In the second additional doping process 24, a boron-based material may be doped. The boron-based material may include B, BF$_2$, BF$_3$, or B$_2$H$_6$. The second additional doping process 24 may be performed by implantation or plasma doping (PLAD).

In the case of using B$_2$H$_6$, it is advantageous to dope a great amount of boron during a short time period through the plasma doping (PLAD) such that contact resistance is also very superior. In another embodiment, the second additional dopant may include P, As, In, Sb, or a combination thereof.

The second additional doping process 24 may be performed with zero tilt-implantation. In another embodiment, the second additional doping process 24 may include tilt implantation. In another embodiment, the second additional doping process 24 may include cold temperature tilt implantation, room temperature tilt implantation or hot temperature tilt implantation. The second additional doping process 24 may be performed at a tilt angle of 1° to 45°. Furthermore, the tilt implantation may be performed while rotating the substrate 11 about 2 times to about 32 times during the second additional doping process.

As described above, in the present embodiment, the additional doping process may be performed by combining the germanium tilt implantation and the boron tilt implantation.

Figure 5G:
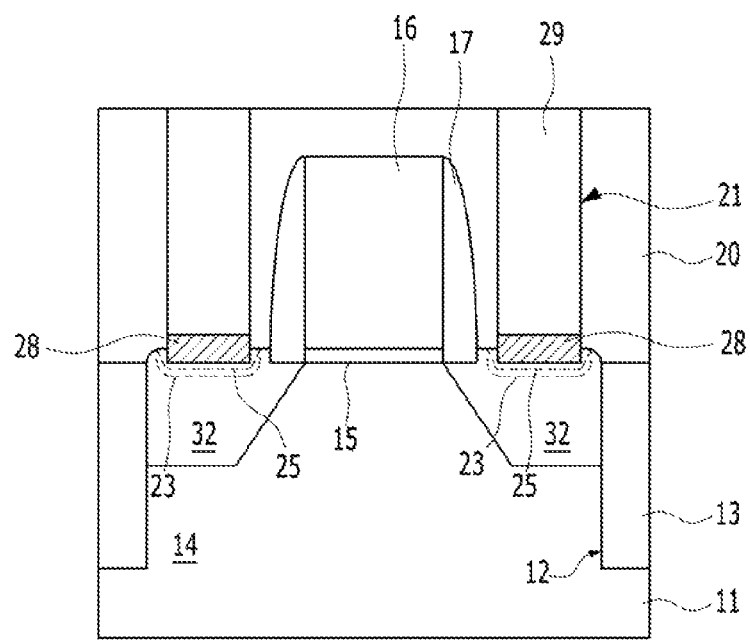

As illustrated in FIG. 5G, a metal silicide 28 may be formed on the source/drain region 32. A contact material 29 may be formed on the metal silicide 28. The metal silicide 28 and the contact material 29 will be formed in substantially the same manner as shown FIG. 3E to FIG. 3G.

Figure 6:
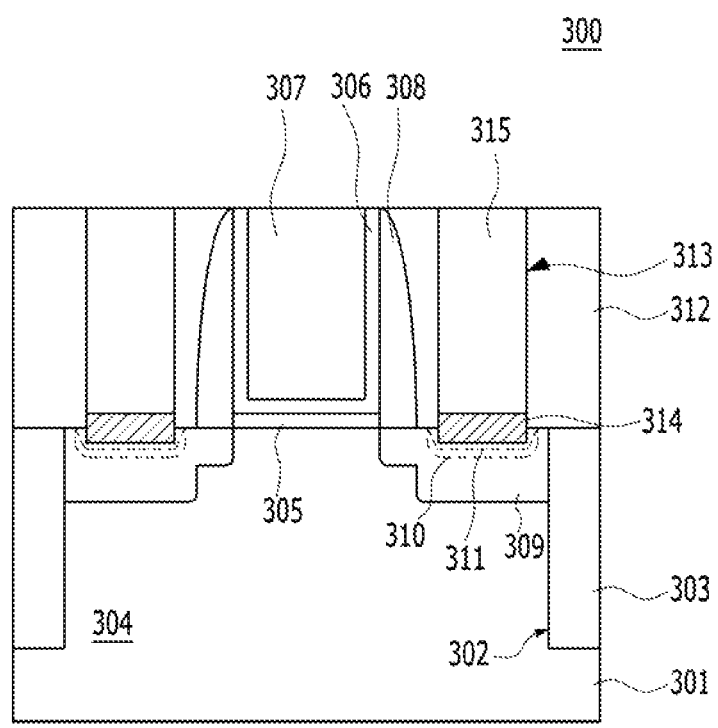
FIG. 6 is a diagram illustrating a semiconductor device in accordance with a third embodiment.

FIG. 6 is a diagram illustrating a semiconductor device in accordance with a third embodiment. As a part of the semiconductor device, a transistor 300 is illustrated. A gate electrode of the transistor 300 may be formed by a gate last process.

Referring to FIG. 6, an isolation layer 303 and an active region 304 may be formed in a substrate 301. The isolation layer 303 may be filled in an isolation trench 302.

A gate stack may be formed on the active region 304. The gate stack may include an interfacial layer 305, a gate insulating layer 306, and a gate electrode 307. The gate stack may further include a spacer 308. A source/drain region 309 may be formed in the active region 304 at both sides of the gate stack. An interlayer dielectric layer 312 may be formed on the substrate 301. The interlayer dielectric layer 312 may include a contact hole 313 for exposing the source/drain region 309.

A first additional doping region 310 may be formed in the source/drain region 309. A second additional doping region 311 may be formed in the first additional doping region 310. The contact hole 313 may expose a part of the second additional doping region 311. The first additional doping region 310 may include germanium. The first additional doping region 310 may be formed by germanium tilt pre-amorphization implant. The second additional doping region 311 may include boron.

A metal silicide 314 may be formed on the second additional doping region 311. A contact material 15 may be formed on the metal silicide 314. The contact material 315 may fill the contact hole 313. The gate last process may be performed as follows.

Figure 7A:
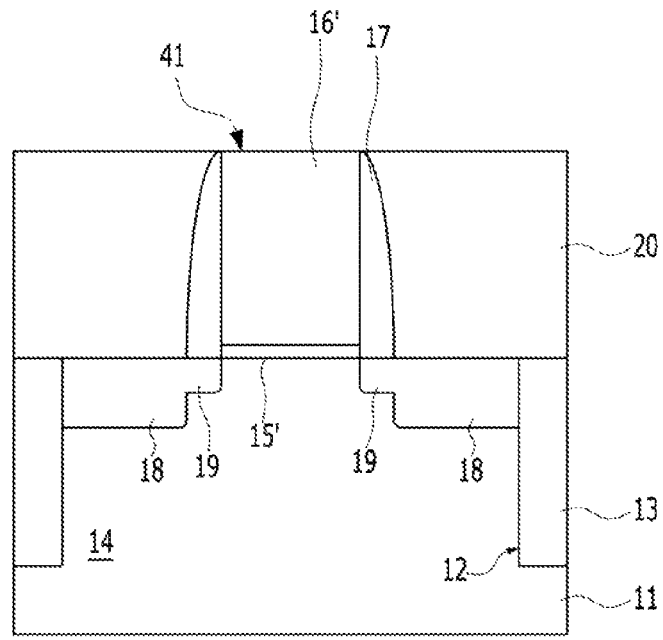
FIG. 7A to FIG. 7F are sectional views illustrating a method for fabricating a semiconductor device in accordance with the third embodiment.

FIG. 7A to FIG. 7F are sectional views illustrating a method for fabricating the semiconductor device in accordance with the third embodiment. As illustrated in FIG. 7A, an isolation layer 13 and an active region 14 may be formed in a substrate 11. A dummy gate stack 41 may be formed on the substrate 11. The dummy gate stack 41 may include a dummy gate insulating layer 15' and a dummy gate electrode 16'. A spacer 17 may be formed at both sidewalk of the dummy gate stack 41. In the present embodiment, the dummy gate stack 41 may be a part of a PMOSFET.

Doped regions may be formed in the active region 14 of the substrate 11. The doped regions may include a source/drain region 18. The source/drain region 18 may be formed by a doping process such as implantation. The source/drain region 18 is a region doped with a dopant material such as an n type dopant and a p type dopant. For example, the dopant material may include phosphorous (P), arsenic (As), antimony (Sb), or boron (B). In the present embodiment, the source/drain region 18 may be a p type source/drain region doped with boron. The source/drain region 18 may include an LDD region 19 or SDE. In detail, the LDD region 19 may have a dopant concentration lower than that of the source/drain region 18. The LDD region 19 and the source/drain region 18 may include substantially the same dopant. In the present embodiment, the source/drain region 18 and the LDD region 19 may be a part of the PMOSFET.

An interlayer dielectric layer 20 may be formed on the substrate 11. The interlayer dielectric layer 20 may include silicon oxide, silicon nitride or a combination thereof. The interlayer dielectric layer 20 may be formed using a low-k material. The interlayer dielectric layer 20 may be planarized to expose an upper surface of the dummy gate stack 41.

Figure 7B:
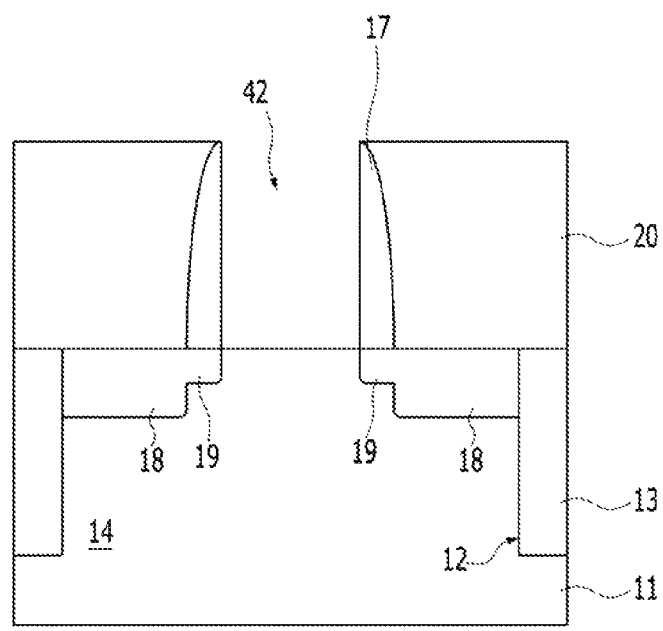

As illustrated in FIG. 7B, a gate trench 42 may be formed. The gate trench 42 may be formed by removing the dummy gate stack 41.

Figure 7C:
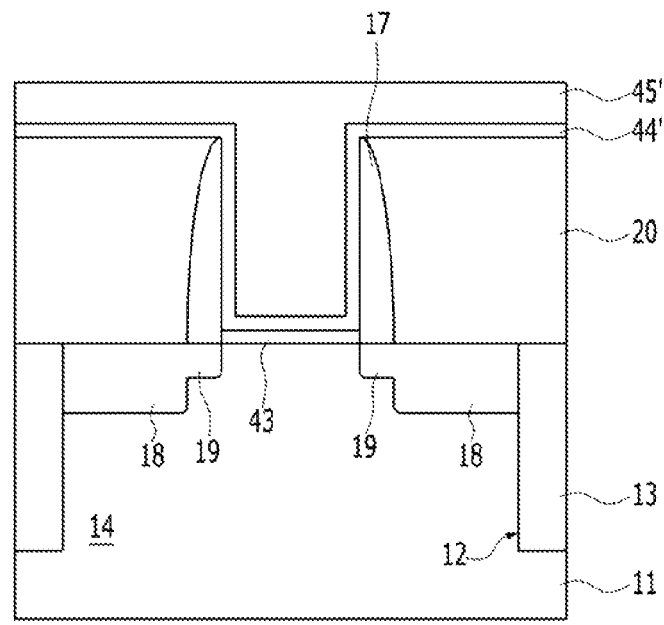

As illustrated in FIG. 7C, an interfacial layer 43 may be formed. The interfacial layer 43 may be formed by oxidizing the active region 14 exposed in the gate trench. However, the present technology is not limited thereto. The interfacial layer 43 may include silicon oxide or silicon nitride.

A high-k layer 44' may be formed. The high-k layer 44' may be conformally formed along the sideman and the bottom surface of the gate trench 42. The high-k layer 44' may also be formed on the upper surface of the interlayer dielectric layer 20. The high-k layer 44' may serve as a gate insulating layer.

A gate layer 45' may be formed on the high-k layer 44'. The gate layer 45' may fill the gate trench 42. The gate layer 45' may include doped polysilicon, a metal, a metal alloy, silicide, or one, two or more conductive materials such as other appropriate conductive materials. The gate layer 45' may include a multilayer structure having multiple metal materials. In another embodiment, to obtain an improved critical voltage, the gate layer 45 may include a material obtained by tuning a work function. In some embodiments, the gate layer 45' may be a material having a work function equal to or more than 4.5 eV when the gate layer 45' serves as a PMOSFET. In another embodiment, the gate layer 45' may be a material having a work function equal to or less than 4.5 eV) when the gate layer 45' serves as a NMOSFET.

Figure 7D:
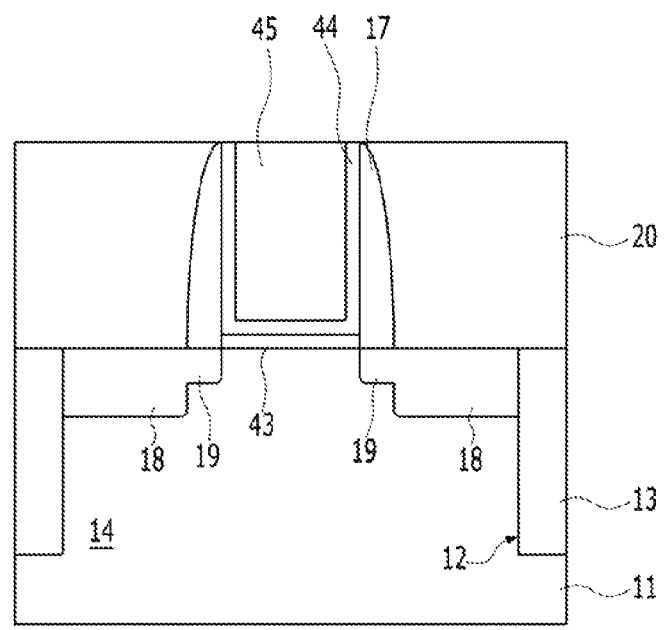

As illustrated in FIG. 7D, a gate electrode 45 may be formed. The gate electrode 45 may be formed by planarizing the gate layer 45'. The high-k layer 44' may be planarized such that a high-k layer 44 is positioned in the gate trench 42. As described above, the gate electrode 45 may be formed by the gate last process.

Figure 7E:
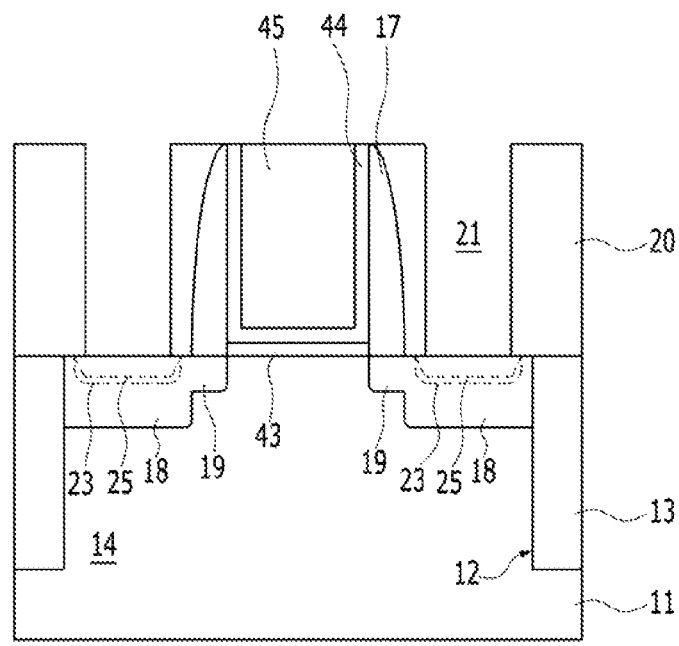

As illustrated in FIG. 7E, a contact hole 21 may be formed in the interlayer dielectric layer 20. The contact hole 21 may expose the source/drain region 18. In the present embodiment, to reduce contact resistance, an additional doping process may be performed after the contact hole 21 is formed. That is, to reduce contact resistance between a contact material which will be formed later and the source/drain region 18 the additional doping process may be performed.

In the additional doping process, a first additional doping process and a second additional doping process may be performed. The additional doping processes will be performed in substantially the same manner as the above-described embodiments. By the second additional doping process, a second additional doping region 25 may be formed.

Figure 7F:
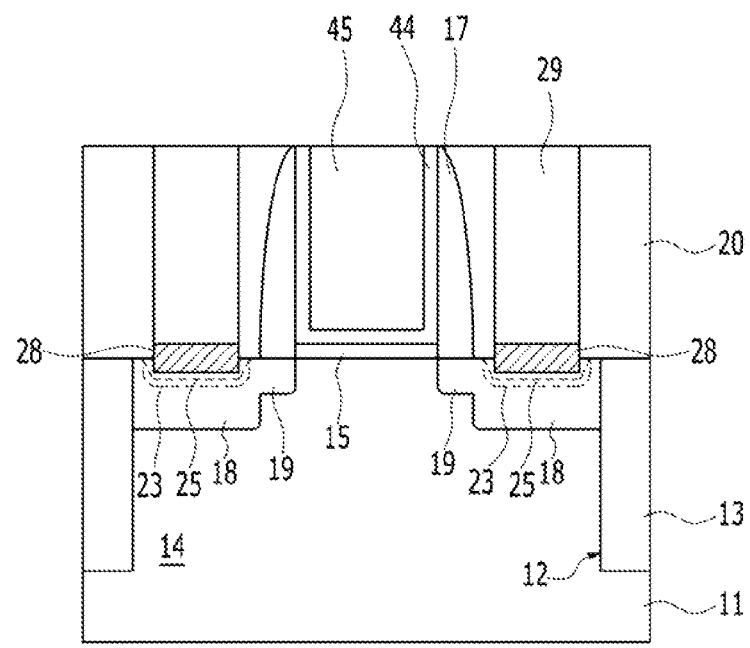

As illustrated in FIG. 7F a metal silicide 28 may be formed on the source/drain region 18. Next, a contact material 29 may be formed on the metal silicide 28.

Figure 8A:
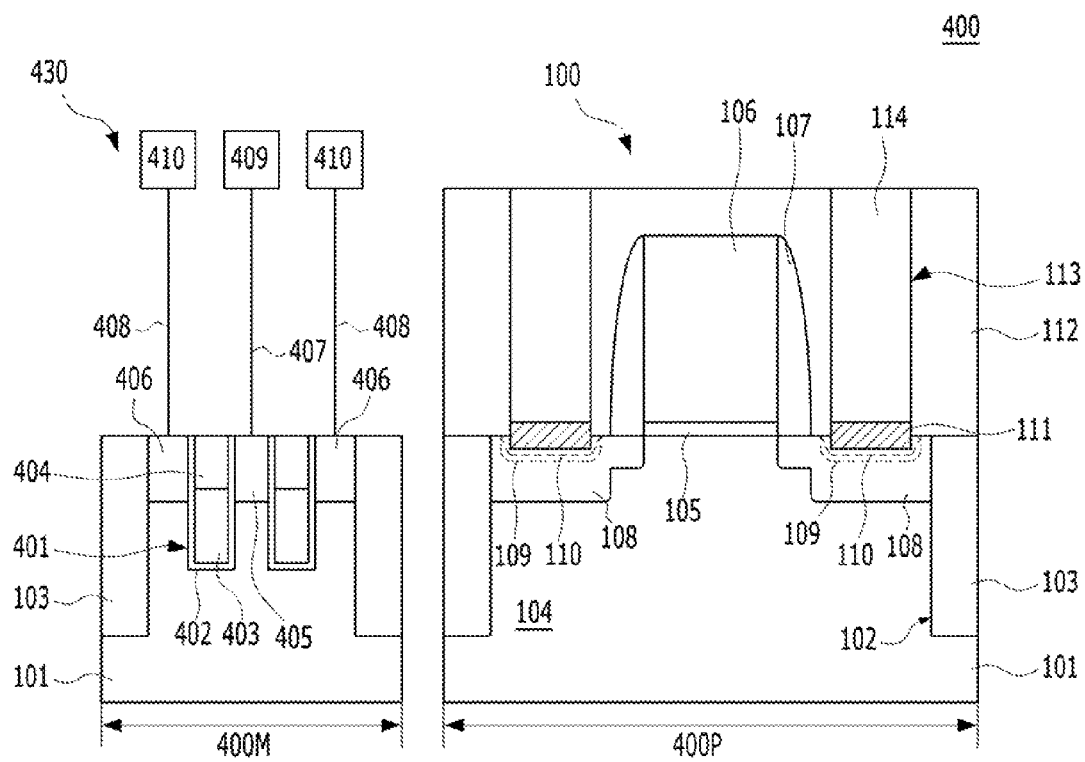
FIG. 8A is a diagram illustrating a semiconductor device in accordance with a fourth embodiment.

FIG. 8A is a diagram illustrating a semiconductor device in accordance with a fourth embodiment. As a part of the semiconductor device, a memory device 400 is illustrated. The memory device 400 may include a DRAM. The memory device 400 may include a memory cell 430 and a peripheral transistor 100. The peripheral transistor 100 may be the transistor 100 in accordance with the first embodiment.

As illustrated in FIG. 8A, the memory device 400 may include a memory cell area 400M and a peripheral circuit area 400P. The memory cell area 400M and the peripheral circuit area 400P may be isolated from each other by an isolation layer 103. The memory cell area 400M may include a cell transistor, a bit line 409 and a memory element 410. The transistor may include a buried gate structure. The buried gate structure may include a cell gate trench 401, a cell gate insulating layer 402 on the surface of the cell gate trench 401, a buried gate electrode 403 positioned in the cell gate trench 401, and a gate capping layer 404 on the buried gate electrode 403.

The transistor may include a first contact node region 405 and a second contact node region 406 formed at both sides of the buried gate structure. Each of the first contact node region 405 and the second contact node region 406 may be a doped region doped with a dopant. Each of the first contact node region 405 and the second contact node region 406 may be a source/drain region. A bit line contact plug 407 and a bit line 409 may be coupled to the first contact node region 405. A storage node contact plug 408 and the memory element 410 may be coupled to the second contact node region 406. The memory element 410 may include a capacitor.

The peripheral circuit area 400P may include the peripheral transistor 100. The peripheral transistor 100 may include a planar gate structure. The peripheral transistor 100 may be the transistor 100 in accordance with the first embodiment. Accordingly, the peripheral transistor 100 may include the gate stack and the source/drain region 108. The gate stack may include the gate insulating layer 105 and the gate electrode 106. The gate electrode 106 may have a stack structure of a ploy silicon layer and a metal base layer. The metal base layer may be a stack of a metal barrier layer and a metal layer. The gate electrode 106 and the bit line/bit line contact plug 409 and 407 may be simultaneously formed. The peripheral transistor 100 may be a PMOSFET.

The memory device 400 may further include additional doping regions formed by an additional doping process. For example, a first additional doping region 109 and a second additional doping region 110 may be formed in the source/drain region 108 of the peripheral circuit area. The first additional doping region 109 may be formed by a first additional doping process. The second additional doping region 110 may be formed by a second additional doping process. The first additional doping region 109 may be formed by germanium tilt implantation. The second additional doping region 110 may be formed by tilt implantation of a boron-based material. The second additional doping region 110 may be formed by plasma doping of the boron-based material. The first and second additional doping regions 109 and 110 may also be formed in the storage node contact plug 408.

As described above, in the peripheral circuit area 400P, the first and second additional doping regions 109 and 110 may be formed between the source/drain region 108 and the metal silicide 111. As described above, the additional doping regions are formed to improve contact resistance between the source/drain region 108 and the metal silicide 111.

Figure 8B:
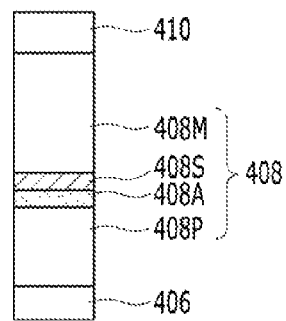
FIG. 8B is a diagram illustrating a storage node contact plug of FIG. 8A.

FIG. 8B is a diagram illustrating the storage node contact plug of FIG. 8A. Referring to FIG. 8B, in the storage node contact plug 408, a polysilicon plug 408P, a metal silicide 408S, and a metal plug 408M may be sequentially stacked. An upper portion of the storage node contact plug 408 may include an additional doping region 408A between the polysilicon plug 408P and the metal silicide 408S. The additional doping region 408A may include at least germanium. The additional doping region 408A may include germanium, boron or a combination thereof. The additional doping region 408A may be formed by the above-described embodiments. The additional doping region 408A may be formed by at least germanium tile implantation. The additional doping region 408A may be formed by germanium tile implantation and B$_2$H$_6$ plasma doping. The metal silicide 408S may include cobalt silicide. The metal plug 408M may include tungsten.

As described above, the additional doping region 408A is formed to improve the contact resistance of the storage node contact plug 408. According to the embodiments, additional doping processes are performed before performing a metal silicide process to further reduce contact resistance.

According to the embodiments, germanium tilt implantation is performed in an additional doping process so that crystalline defects are reduced and the diffusion of boron in a channel direction is controlled, thereby improving contact resistance characteristics and simultaneously gate-induced drain leakage (GIDL) characteristics.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:
   preparing a semiconductor substrate;
   performing an implantation to form a source/drain region in the semiconductor substrate
   performing a tilt pre-amorphization implantation using a first additional dopant to form a first additional doping region in the source/drain region;
   performing a plasma doping using a second additional dopant to form a second additional doping region in the first additional;
   forming a metal layer on the second additional doping region; and
   reacting the first and second doping regions with the metal layer to form metal silicide,
   wherein the tilt pre-amorphization implantation is performed after the source/drain region is formed, and
   wherein the plasma doping is performed after the tilt-amorphization implantation.

2. The method for fabricating a semiconductor device of claim 1, wherein the first additional dopant includes germanium (Ge).

3. The method for fabricating a semiconductor device of claim 1, wherein the tilt pre-amorphization implantation is performed at a tilt angle of 1° to 45°, and
   wherein the tilt angel is measured in reference to a line perpendicular to an upper surface of the substrate.

4. The method for fabricating a semiconductor device of claim 1, wherein the first additional dopant includes C, N, F, Si, Sn, In, Xe, or a combination thereof.

5. The method for fabricating a semiconductor device of claim 1, wherein the tilt pre-amorphization implantation of the first additional dopant is performed with the semiconductor substrate being rotated.

6. The method for fabricating a semiconductor device of claim 1, wherein the tilt pre-amorphization implantation of the first additional dopant is performed at a dose of $1.0 \times 10^{13}$ atoms/cm$^2$ to $1.0 \times 10^{16}$ atoms/cm$^2$, with ion implantation energy of 0.1 keV to 60 keV, and at an electrostatic chuck temperature of −150° C. to 400° C.

7. The method for fabricating a semiconductor device of claim 1, wherein the second additional dopant includes B$_2$H$_6$, and the first additional dopant include germanium (Ge).

8. The method for fabricating a semiconductor device of claim 1, wherein the second additional dopant includes a boron-based material.

9. The method for fabricating a semiconductor device of claim 1, wherein the second additional dopant includes B, BF, BF$_2$, BF$_3$, B$_2$H$_6$, P, As, In, Sb, or a combination thereof.

10. The method for fabricating a semiconductor device of claim 1, wherein the doping region includes a source/drain region of a PMOSFET.

11. The method for fabricating a semiconductor device of claim 1, further comprising:
    forming a metal material coupled to the metal silicide.

12. A method for fabricating a semiconductor device, comprising:
    forming a transistor including a source/drain region in a semiconductor substrate;
    forming an interlayer dielectric layer over the semiconductor substrate;
    patterning the interlayer dielectric layer to form a contact hole that exposes the source/drain region;
    performing germanium tilt implantation to form an amorphous region in the source/drain region;
    performing, a plasma doping with a boron-based material in the amorphous region;
    forming a metal layer on the doped amorphous region; and
    reacting the doped amorphous region with the metal layer to form metal silicide,
    wherein the germanium tilt implantation is performed after the source/drain region is formed, and
    wherein the plasma doping is performed after the germanium tilt implantation.

13. The method for fabricating a semiconductor device of claim 12, further comprising:
    removing an unreacted metal layer remaining on the metal silicide; and
    forming a contact material filling the contact hole and coupled to the metal silicide.

14. The method for fabricating a semiconductor device of claim 12, wherein the germanium tilt implantation is performed at a tilt angle of 1° to 45°, and
    wherein the tilt angel is measured in reference to a line perpendicular to an upper surface of the substrate.

15. The method for fabricating a semiconductor device of claim 12, wherein the germanium tilt implantation is performed with the semiconductor substrate being rotated.

16. The method for fabricating a semiconductor device of claim 12, wherein the germanium tilt implantation is performed at a dose of $1.0 \times 10^{13}$ atoms/cm$^2$ to $1.0 \times 10^{16}$ atoms/cm$^2$, with ion implantation energy of 0.1 keV to 60 keV, and at an electrostatic chuck temperature of −150° C. to 400° C.

17. The method for fabricating a semiconductor device of claim 12, wherein the boron-based material includes B$_2$H$_6$.

18. The method for fabricating a semiconductor device of claim 12, wherein the source/drain region includes a p type doped source/drain region of a PMOSFET.

19. The method for fabricating a semiconductor device of claim 12, wherein the metal silicide includes cobalt silicide.

* * * * *